United States Patent [19]

Caprari

[11] 4,348,105
[45] Sep. 7, 1982

[54] RADIATION SHADOW PROJECTION EXPOSURE SYSTEM

[75] Inventor: Fausto Caprari, East Brunswick, N.J.

[73] Assignee: RCA Corporation, New York, N.Y.

[21] Appl. No.: 259,362

[22] Filed: Apr. 30, 1981

[51] Int. Cl.³ .............................................. G03B 27/54
[52] U.S. Cl. ....................................... 355/67; 353/102
[58] Field of Search ........................... 355/67; 353/102

[56] References Cited

U.S. PATENT DOCUMENTS

| 3,860,335 | 1/1980 | Caprari | 353/102 |
| 4,243,917 | 1/1981 | Caprari | 315/241 |

OTHER PUBLICATIONS

D. A. Doane, "Optical Lithography in the 1-μm Limit," *Solid State Technology*, Aug. 1980, pp. 101–114.
Jenkins and White, *Fundamentals of Optics*, McGraw-Hill, 1957, pp. 52–53.

*Primary Examiner*—Monroe H. Hayes
*Attorney, Agent, or Firm*—Birgit E. Morris; Donald S. Cohen; Joseph D. Lazar

[57] ABSTRACT

A radiation system for projecting a uniform field of irradiance to expose an irradiance-sensitive surface (such as a photomask) through a transparency in proximity to, or in contact with, the irradiance sensitive surface (such as a wafer or another mask) comprises a pulsed source of irradiance in the near and deep ultraviolet wavelength spectrum, a doublet condenser lens and doublet field lens disposed serially along an optical axis. Every point in the exposure plane surface is focused on the transparency which is in the exposure plane. The two planes are conjugates of each other and vice versa. For every opening in the mask pattern to be resolved on a photoresist coated wafer or mask there exists a well-defined ray bundle passing through the conjugate point located on the exposure plane conjugate surface. One advantage of the doublet field lens is that its large diameter makes possible the transmission of marginal ray bundles without vignetting on the exposure plane.

10 Claims, 6 Drawing Figures

RADIATION SHADOW PROJECTION EXPOSURE SYSTEM

BACKGROUND OF THE INVENTION

This invention relates to radiation systems, and more particularly to a radiation projection printer using actinic lithography for providing a uniform field of irradiation for making contact or proximity prints on wafers and masks.

In the field of optical exposure systems for exposing photoresist material deposited on wafers in the production of integrated circuits and the like, the mask is positioned in close proximity to the wafer at the lens exposure plane which is characterized by a relatively uniform field. By so positioning the mask, one is utilizing the principle used in systems that are at times called "reverse projection systems" or "shadow projection systems" using refractive optics. It should be understood that the uniform field of the irradiance source is effectively projected through the mask and thence to the proximate wafer, whereas in a conventional projection system the lens projects the image of the object mask onto a wafer that is remotely positioned from the object mask. A reverse projection system which, as just indicated, may be also termed a shadow projection system, is described in my U.S. Pat. No. 3,860,335 entitled "OPTICAL SYSTEM" issued on Jan. 14, 1975.

Reference is made to an article by D. A. Doane, entitled "Optical Lithography in the 1-$\mu$m Limit" published in *Solid State Technology*, August 1980, pp. 101-114 for a description of the state of the art and particularly the problems confronting those in optical lithography.

While the shadow projection system of the type described in my aforementioned patent performs adequately for systems in which the smallest linewidths of the wafers are in the order of seven micrometers, as the art advances, there is a need for still finer resolution of linewidths on wafers and masks on the order of 5 micrometers and, more importantly, on the order of 1-3 micrometers. Such a resolution could not be achieved heretofore by the use of various types of lamp sources such as mercury arc lamps and other similar lamp irradiance sources that do not provide uniform light distribution over a broad spectral region. Helical xenon flash tubes are known to develop a broad spectrum of radiation in the actinic spectral region. Such polychromatic radiation it now appears is extremely useful in developing very fine resolution lines. However, in order to achieve such fine resolution, there is an additional problem of collecting a broader spectra from the source to project onto the mask and to do so with a lens systems that has a higher numerical aperture (N.A.) with a minimum of diffraction effects and spherical aberration.

There is a need, therefore, for a system of the shadow projection system type to provide improved resolution and uniformity in the projected image.

SUMMARY OF THE INVENTION

According to the present invention, a shadow projection radiant system is provided with input and output lenses formed respectively of plano-convex lenses. An entrance pupil positioned between the input lens and output lens develops an image of the radiant source through the input lens that is not formed on the exposure plane. A source of polychromatic radiance provides a plurality of ray bundles of partially coherent radiance. The lenses are arranged to provide an aperture sufficiently large to collect the entire spectrum of the polychromatic radiance for projection through a mask, each of the ray bundles emanating from a particular source point and all of the bundles converging at the same vertex on the mask plane. The mask passes the irradiance through to a proximate projected plane in which a wafer or another mask for processing is disposed. As a result of the polychromatic radiance, generated from a spatially distributed xenon source, dispersion causes the source to be spread into a plurality of effective sources, each effective source representing a particular wavelength of the radiance spectrum. Accordingly, the many effective images of the distributed source cause a large cone angle of radiance to be developed at the output of the output lens resulting in a large numerical aperture (which is a function of the cone angle). As a consequence, diffraction effects that are otherwise manifested at the mask openings are significantly reduced. Moreover, the field of irradiance on the exposure plane is made more uniform due to the substantially unattenuated bundles of radiant rays.

DETAILED DESCRIPTION OF THE PREFERRED EMBODIMENT

Figure 1:
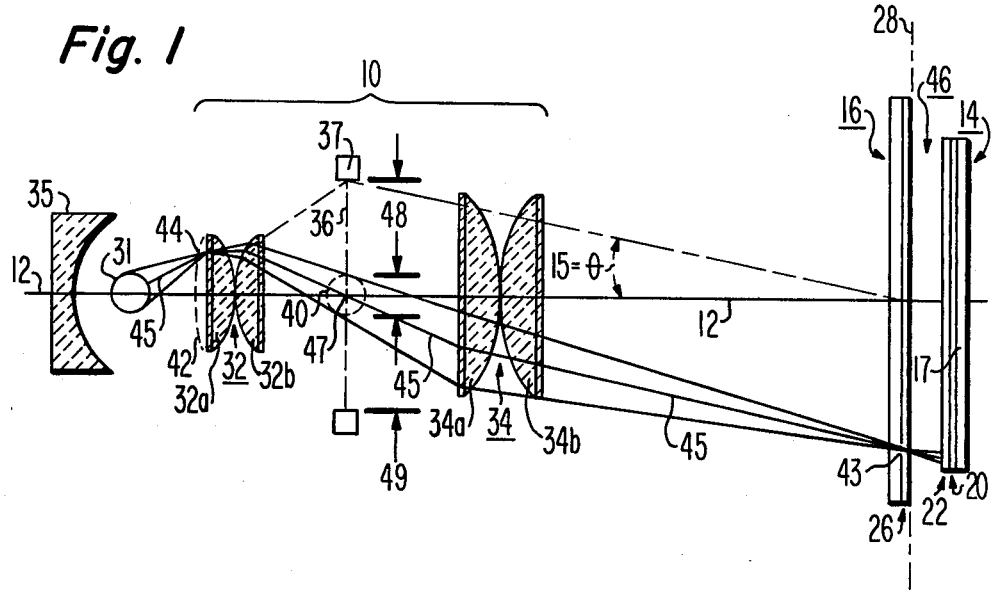
FIG. 1 is a schematic of a preferred embodiment of the radiant projection printer system of the invention.

As shown in FIG. 1, the radiant or more commonly known "optical" components (lenses 32 and 34 to be described) are disposed along an optical axis 12 for exposing a radiation sensitive element 14 with radiation projected through a transparency 16. The terms "light" and "optical" it should be noted relate in a precise sense of use to electromagnetic radiation phenomena in the human visible range. However, this art has generally used the terms "optical" and "light" to connote spectra in the infrared and ultraviolet ranges. Accordingly, the terms "optic," "optical" or "light" as may be used herein will be understood to mean in that conventional sense that the radiation spectrum is not limited to the human-sensed spectrum.

The radiation sensitive element 14, to be described, comprises a wafer formed of a substrate 17 of semiconductor fabrication material, a layer 20 of silicon dioxide or other material to be defined and a layer 22 of photoresist material. The wafer 14 is shown in enlarged detail in FIG. 4. The invention may be used also with any radiation sensitive element in the form of a photomask havings a photoresist surface which is to be exposed and developed. Examples of suitable photosensitive materials include emulsions and diazos.

Figure 4:
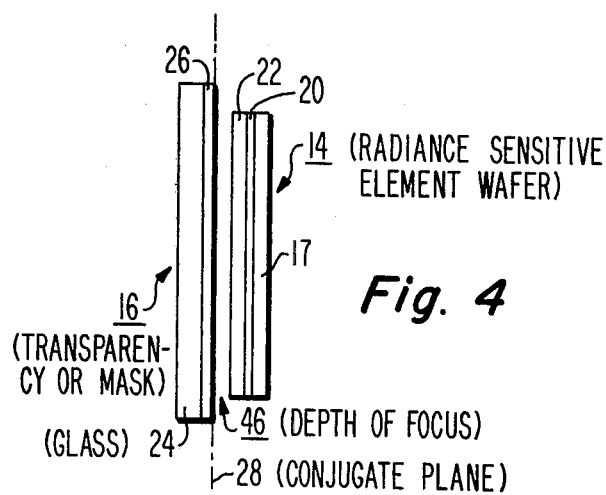
FIG. 4 is an enlarged fragmentary portion of the system illustrated in FIG. 1 showing the details of the photomask and wafer at the exposure plane of the system.

The transparency 16 comprises a master photomask formed of a glass plate 24, as shown in FIG. 1 and enlarged in FIG. 4, with a layer 26 of a material defining an image derived previously, such as in a chromium pattern, for example, to be reproduced by this apparatus on the wafer 14. The photoresist layer 22 of the radiation sensitive wafer element 14 is in contact with or in close proximity (typically within 15 micrometers) to the patterned layer 26 of the transparency 16, the surface of layer 26 being in the conjugate plane 28 of the system as will be further described. The wafer element 14 must be positioned parallel to the transparency 16 within the depth of focus of the system as represented by the space identified as reference numeral 46 in FIG. 1. For this description the plane in which the element 14 is positioned for exposure particularly the photoresist layer 22 thereof, is called the "projection plane."

A spatially distributed radiant source 31 such as a xenon flash lamp formed from a helix, when suitably energized, provides a very intense pulsed source of radiation in the near and deep ultraviolet electro-magnetic spectrum. The source 31 is preferably formed of the helix having an outside diameter of 2.54 cm (1") and being 2.54 cm (1") high. FIG. 1 shows the source 31 from a top view. Such a radiance source can be driven in current densities greater than 3,000 amperes/sq. cm. and operate thereby at very high efficiency. It has a pulse repetition rate in the order of one flash per second. A conversion efficiency of about 60% with a high output of deep ultraviolet radiant power is achieved with such a helical xenon lamp. The average or integrated output from such lamps is in the order of four times greater than the conventional d.c. mercury xenon lamps used heretofore. Preferably, the xenon flash lamp 31 is provided with a shield to isolate the more intense anode and cathode regions of the helical arrangement from being exposed when energized to the optical system. A preferred circuit for driving such a lamp is disclosed in my U.S. Pat. No. 4,243,917, which issued on Jan. 6, 1981, entitled "FLASH LAMP DRIVE CIRCUIT." The radiance source 31 is positioned transversely to the optical axis 12 and develops a bundle of rays of beams 45 as will be further discussed. The terminology herein of explaining the passage of radiation simply by the term "ray bundles" is well-known in the art and is being used as such in this description to simplify the description.

A concave mirror 35 is disposed on the axis 12 behind the source 31 to reflect radiation along the axis further increasing the efficiency of the radiance source 31. A lens system 10 comprises an input lens 32 and an output lens 34. Lens 32 is formed of plano-convex lens elements 32a and 32b serving as the condenser portion of the lens system 10 and plano-convex lens elements 34a and 34b serving as the field lens 34 of the lens system 10, respectively. Both lenses 32 and 34 are formed of positive convex lenses 32a and 32b and 34a and 34b, respectively. The condenser lenses 32 and field lens 34 are made of synthetic quartz. The effective focal lengths of the condenser lens 32 and the field lens 34, for example, are 2.5 inches (6.4 cm) and 6.0 inches (15.2 cm), respectively.

An aperture stop 37, preferably structured as a square to form square-image masks or wafers as presently used in the semiconductor art, is disposed in the plane 36 of the entrance pupil to the field lens 34 between the condenser lens 32 and the field lens 34.

The condenser lens 32 is positioned to project an image 40 of the xenon lamp 31 into the entrance pupil plane 36 and to provide the system with a linear magnification of the radiant source of about one. Image 40 thus serves as the effective source of the system at about unity magnification. Because of the unity magnification, there is no need to correct the lenses for spherical aberration. Accordingly, much less expensive lens elements can be used than are otherwise required for systems in which the magnification of the input lens is greater than unity.

In the embodiment illustrated, the condenser lens 32 and the field lens 34 together with the aperture stop 37 are equivalent to a four element projection lens of 9 inches (22.9 cm) in length and 4 inches (10.2 cm) in diameter with an effective focal length of 4.6 inches (11.7 cm) and numerical aperture (NA) of 0.14.

The radiance plane 28 in which the transparency mask 16, particularly the mask layer 26 is disposed, can be considered as the projection of the exposure plane conjugate surface 42 located between the lamp 31 and the condenser 32, and vice versa. The exposure plane conjugate surface 42 is typically a portion of an ellipsoid surface 42 having the general curvature indicated in the drawing. Surface 42 may be spherical, if desired. For this description the surface 42 is considered to be essentially "planar." Thus, the exposure plane conjugate surface 42 is the conjugate of the exposure plane 28 projected by the lens system 10. Moreover, every point in the exposure plane conjugate surface 42 is projected by both the condenser lens 32 and the field lens 34 and focused on the radiance exposure plane 28 and vice versa. This phenomenon is analogous to the interchangeability of the image plane and the object plane as known in the conventional projector art as being the conjugate of one plane with the other. The depth of focus and the resolution of the radiance conjugate plate 28 are functions of (1) the size of the aperture stop 37 in the entrance pupil plane 36, (2) the effective focal length of the combination of the lenses of lens 10 and (3) the wavelength of the radiation from the source 31. The line and space resolution of the system illustrated is about 1 micrometer at 12 micrometers separation between the mask 16 and the projection plane 14 for a radiance source at a wavelength $\lambda$ of 220 nanometers.

In the practice of the invention, the entrance pupil plane 36 is located in the vicinity of the nodal point 47 of the lens 10 where the xenon lamp image 40 is focused by the plano-convex condenser lens 32. The plano-convex lens elements 34a and 34b for the field lens 34 are designed so that the entire mask field is exposed uniformly and so that there is no vignetting. Lens 34 is made large enough in diameter such that the sine of the half cone angle 15 equals the desired numerical aperture (N.A.). The numerical aperture in optics is included in the well known relationship.

$$d = K\lambda/(N.A.) \tag{1}$$

where $\lambda$ is the peak wavelength response of the photoresist material (layer 22 of wafer 14), K is a factor depending on coherence, being 0.61 for incoherent illumination and 0.77 for coherent illumination, and d equals the minimum separable distance of two object points, this distance being the Airy disc radius. The resolution of this system according to the invention is thus defined by the Airy disc radius "d". Moreover, the size of lens 34 is critically important to be large enough to transmit all the ray bundles without vignetting. This aspect of the system will be described further and illustrated in conjunction with the schematics of FIGS. 2A-2C.

Equation (1) meets the well-known Rayleigh criterion for resolution in order to achieve such a minimum separation distance (d). This criterion is manifested in the line and space resolution in the photoresist. Moreover, in order to effect complete transmission of all the spectra needed to achieve such desired resolution, it became necessary to provide a wider field lens than was generally available in the art. Furthermore, in order to provide a wider lens of the same focal length, one tends to get undesired spherical aberration in view of the very large curvature that is needed to achieve the same or nearly the same focal length. It is for this reason that in order to achieve such high resolution, and moreover to provide the depth of focus needed to allow for separation 46 between the mask 16 and a wafer or mask 14 of as much as 20 micrometers, the field lens 34 was arranged to be a double plano-convex pair of elements 34a and 34b. It was been discovered, by using the double-element for field lens 34 in plano-convex form, that both a higher numerical aperture (N.A.) as well as a higher resolution can be achieved as will be further explained. In terms of actual measurements of the uniformity in the field irradiance provided by the system of the present invention, improvements in the order of 30% to 50% over that provided by the system described in my U.S. Pat. No. 3,860,335 was achieved. The plano-convex lens elements 34a and 34b provide more uniformity of radiation over the field of the mask or wafer 14. The uniform illumination is achieved, in part, because the image 40 of the xenon source is formed at the plane of the entrance pupil plane 36 and accordingly not formed on the exposure plane 28, that is, the plane in which the mask 26 is positioned.

In addition to determining the numerical aperture (N.A.) to meet the system requirement of resolution (d), the numerical aperture is used to determine the depth of focus ($\Delta f$) as seen from the following well known equation:

$$\Delta f = K\lambda/(NA)^2 \qquad (2)$$

where $\lambda$ as in equation (1) is the peak wavelength response of the photoresist material (layer 22 of wafer 14), and k is dependent on the coherency factor. The coherency factor $\sigma$ which is spatially rather than temporally determined must, as known in the art, have a value of 0.3 or less in order to print resist lines down to one micrometer wide. The $\sigma$ value can be determined from the relation:

$$\sigma = Ds/Dp \qquad (3)$$

where Ds is the effective source diameter (dimension 48 of the source image 40) and Dp is the entrance pupil diameter (the dimension 49 of the aperture 37). The value of 0.24 for $\sigma$ has been found to provide good results in linewidth control, image contrast and mask to wafer separation (space 46) in the practice of this invention. Values at or below 0.3, however, are satisfactory.

Repeated calculations of equations (1), (2) and (3) are performed to determine the ideally maximum numerical aperture that satisfies the system criteria of resolution (d) and depth of focus ($\Delta f$). With the numerical aperture determined, the cone angle $\theta$ is calculated from the relation:

$$\theta = \sin^{-1}(N.A.) \qquad (4)$$

where $\theta$ is the half cone angle of the ray bundle 45 from a point on the axis 12 with incoherent irradiance in air.

Lenses 32 and 34 are designed in accordance with conventional geometric optic lens design. The rim size of lens 32 determines the maximum size of wafer or mask 14 that can be irradiated with pattern information through mask 16. Accordingly, in the design of lenses 32 and 34 the diameters thereof are selected in accordance with the size of wafer or mask 14 desired. In the preferred embodiment $\theta$ is 8° whereby N.A. = 0.14.

With the size of lenses 32 and 34 determined by conventional calculation based on focal length, the precise positioning of the lenses in relation to the conjugate planes (the surface 42 and the mask surface 28), and the effective source position 47, which I term the nodal point, is preferably determined by the known ray plotting method. See Jenkins and White on *Fundamentals of Optics*, McGraw-Hill, 1957, pp. 52 and 53 for a description of such a method. Experimental bench tests have been used to verify that the ray plotting method is excellent to design a system according to this invention.

In the practice of this invention, achieving a high degree of uniform illumination of the projected plane in which a wafer or mask 14 is disposed, depends upon the precise positioning of (1) the input lens 32, (2) the exit lens 34 in relation to the mask 16 in the exposure plane 28 and (3) the nodal point 47 of the effective source 40. In addition, the size of xenon lamp source 31, its operating conditions including the peak current of excitation and the duration of the pulse generated determine, as well known in the art, the spectrum of radiance that will be generated to irradiate the mask 26. A preferred means for controlling the peak current and its functions is described in my above-identified U.S. Pat. No. 4,243,917. For a given xenon lamp source 31 the plane 28 of the mask 16 is positioned so that the points for the mask openings 43 on the surface 28 are conjugate to the entrance points 44 on the conjugate exposure plane 42 adjacent the input lens element 32a. When the conjugate planes 42 and 28 are properly positioned, the nodal point 47 will be on the entrance pupil plane 36 of the lens system 10. Assuming that the numerical aperture (N.A.) is maximum for the spectrum and for the helical xenon lamp to be used, the half cone angle $\theta$ will accordingly be a maximum.

Moreover, since the helical xenon lamp source 31 provides a distributed source of polychromatic spectrum for irradiance, there will be a dispersion of the irradiance light bundles 45 as they pass through lens 32 and lens 34 towards the wafer surface 22 through the mask 16. Dispersion is effected by the respective different indices of refraction that are manifested for each of the respective different wavelengths of polychromatic radiance from source 31. Accordingly, as each portion of ray bundle 45 corresponding to each wavelength segment of the spectrum is passed through the lens system, the focal length changes. As a result, a plurality of effective sources 40 is developed about the nodal point 47. As a consequence, the effective source 40 develops many bundles of radiance 45 at the entrance pupil plane 36 to the lens 34. The nodal point 47 is determined by the radiance at the mid-point of the spectrum. Thus, for example, if the helical xenon lamp source 31 is of the type that provides substantially deep ultraviolet radiation, in the range of 200-260 nanometers, the nodal point 47 will be defined by the radiance at 230 nanometers.

As a result of these adjustments, every opening, such as opening 43 in the plane 28 of the patterned layer 26 of the mask, will receive a bundle of rays 45 from an opening 44 on the conjugate exposure plane 42 which opening will be the conjugate of the mask opening 43 as explained above. Radiance passing through the opening 43 will then be projected onto the photo resist surface 22 of the wafer 14. There will be a uniform illumination on the wafer 14 because the image 40 of the source 31 is not formed on this exposure plane as explained above, and, moreover because the vertex of all of the bundles 45 emanating from the source 31 will co-exist only at the exposure plane 28 in which the mask 26 is located. Also, since the depth of focus extends at least over the distance of the separation 46, the surface of layer 22 will receive a very high degree of uniform illumination.

Figure 2A:
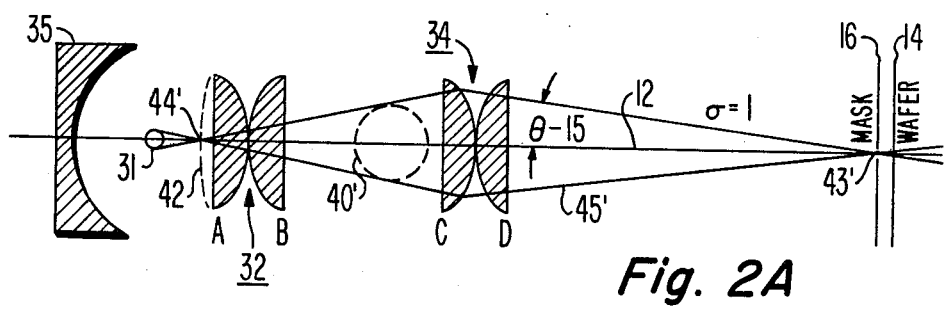
FIGS. 2A, 2B and 2C are simplified schematics of the system illustrated in FIG. 1 illustrating several operating conditions.
Figure 2B:
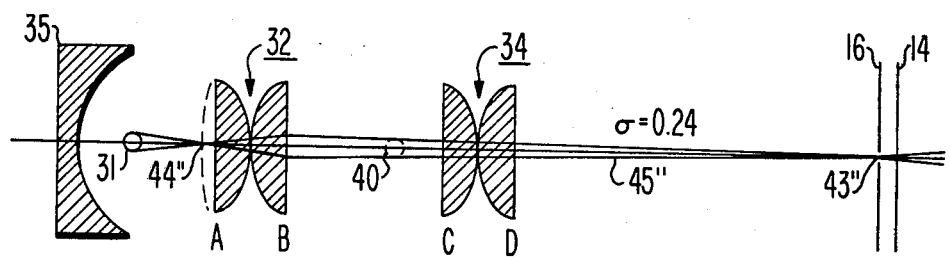
Figure 2C:
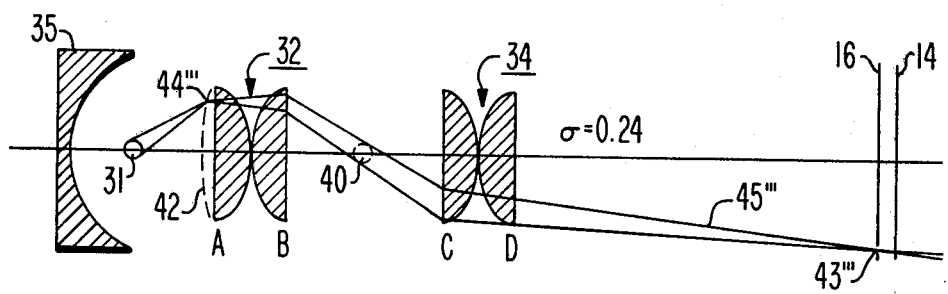

In order to understand the effect of changing the degree of coherent illumination, reference is made to FIGS. 2A, 2B and 2C, respectively. In FIG. 2A there is illustrated a system in which the effective source 40' is a magnification of the source 31 by a factor greater than one so that the factor $\sigma$ is unity, indicative of total coherent illumination. In other words, the diameter of the effective source 40' is equal to the diameter 49 (as shown in FIG. 1) of the entrance pupil 37. In this arrangement it will be seen that the irradiating rays 45' on passing through an opening 43' in the mask 16 located on the axis 12 fills the entrance pupil making the irradiance system incoherent. It should be understood that the arrangement of FIG. 2A is not in accordance with the principles of the present invention.

In FIGS. 2B and 2C, there are illustrated the operation of the system for two respective actinic ray bundles according to the present invention in which the factor $\sigma$ is arranged to equal 0.24. In this arrangement the effective source 40 diameter is equal to the source 31 diameter. The openings 43" and 43''' in the mask 16 on the axis receive bundles of rays of radiance 45" or 45''' which fills 24% (manifested by the percent of incoherency) of the entrance pupil diameter 49.

In the mode shown in FIG. 2C, the bundle of rays 45''' is shown to pass through a mask opening 43''' in the peripheral portion thereof. The conjugate of these openings 43''' is the openings 44''' located on the conjugate surface 42. It will be appreciated that these rays 45''' are the marginal rays that will be passed by the system. According to this invention vignetting of the bundle of rays 45''' will not occur. In the illustrations of FIGS. 2B and 2C, the diffraction effects that would otherwise occur at any of the mask opening 43 edges exposed to any of the rays 45 are reduced a significant amount as compared to my U.S. Pat. No. 3,860,355. In a system according to that patent using polychromatic irradiance vignetting would occur resulting in a smaller aperture and reduced passage of the polychromatic radiance and consequently smaller numerical aperture.

Figure 3:
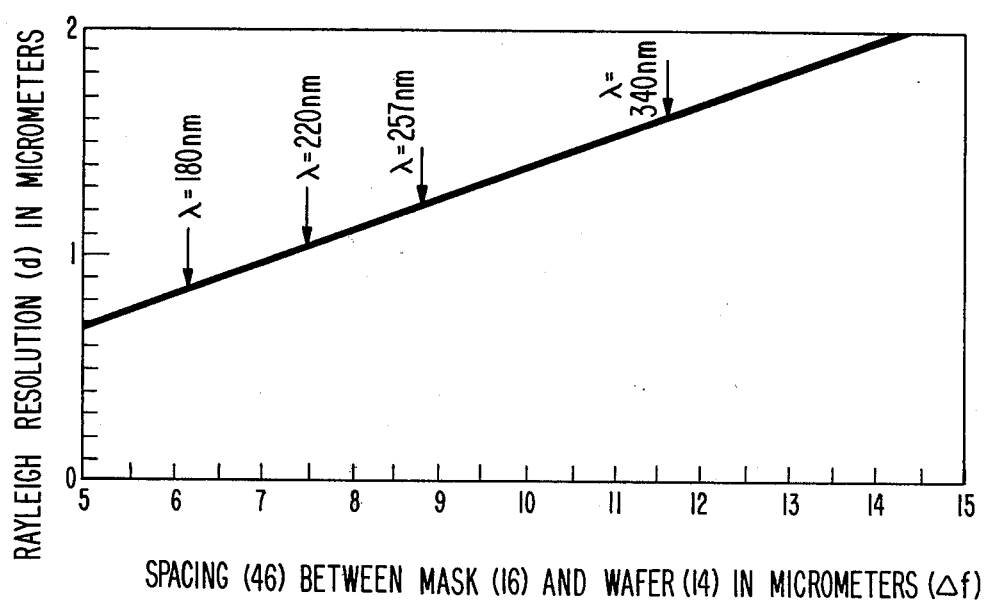
FIG. 3 is a plot of the depth of focus versus the Raleigh resolution in micrometers illustrating one aspect of the operation of the present invention.

The depth of focus determines the maximum spacing 46 that can be allowed before the mask openings 43 are defocused on the layer 22 of the wafer 14. The relationship of the depth of focus as represented by the spacing 46 between the mask 16 and wafer 14 is related to the Rayleigh resolution in micrometers. Thus the resolution (d), is plotted in FIG. 3 for a $\sigma$ value of 0.24, a system numerical aperture (N.A.) value of 0.11 and a K value of 0.67. K is the factor which is a function of $\sigma$ which, for example, is 0.61 for spatially incoherent illumination and is 0.77 for spacially total coherent illumination. This K-factor is used in equation (1) described hereinabove.

Various wavelengths such as 180, 220, 257 and 340 nanometers are shown on the plot representing the peak response wavelengths of suitable photoresist materials that may be used for layer 22 of the wafer 14. For each such photoresist the system when designed as described hereinabove will provide the desired resolution (d) at the spacing 46 between the mask 16 and wafer 14. The spectrum of the source 31 is adjusted to include at least the wavelength corresponding to the selected photoresist material.

The diffraction effects caused by the rays 45 passing across the edges of mask openings 43 are significantly reduced in accordance with the present invention by the provision of an ideally maximum numerical aperture (N.A.) for the lens 10, the use of short wavelength polychromatic radiance, particularly in the deep ultraviolet region and, furthermore, by arranging $\sigma$ to be at a value wherein the radiance is partially coherent. Moreover, the system according to this invention provides significantly high resolution in that linewidths in the order of 1 micrometer are achieved with spacing between the mask plane 28 of the wafer plane 14 of about 12–15 micrometers, and a wavelength of 220 nanometers.

In making an exposure from a mask 16 onto wafer 14 carrying the resist layer 22, the polychromatic extended area radiant source 31 provides one or more pulses of radiance for a total radiance level determined by the type material used for photoresist layer 22. The wafer 14 carrying the photoresist layer 22 is then developed and the layer 20 is etched by photolithographic means well known in the art. After etching, the developed photoresist 22 is removed, leaving a print of the transparency or mask 16 on the radiance sensitive element 14. Any of the known photoresist materials may be used, although, where the ultraviolet spectrum range is to be used, polymethyl methacrylate (PMMA) is preferred, having a peak response at 220 nanometers.

While the equations selected for use in the practice of this invention are based on the principles of geometric optics, it should be understood that higher order diffraction effects, other than the zero order diffraction effects, although present, are ignored. Experiments have shown that the principles of optical conjugacy are not violated for the purposes of this invention. Moreover, the design of the optical components used in the system are based on the assumption that an object placed in the object plane (as done in conventional prior art printers) is a complete conjugate of a mask placed in the image plane (as done in the present invention). This assumption it should be noted ignores the diffraction effects caused by the mask of a conventional projection printer. Nevertheless, my experiments have confirmed that the calculated design values for the depth of focus and the numerical aperture required in the practice of my invention are adequate to achieve the desired resolution and uniformity of field at the projected plane 14.

What is claimed is:

1. In a radiation shadow projection exposure system of the type having a radiant source, an input lens to collect source radiance as an effective source at a nodal point along the optical axis of the system, and an output lens to project the collected source radiance through a mask onto a proximate projected plane wherein the improvement comprises:

said source including means to provide spatially distributed partially coherent illumination of polychromatic radiance;

said input lens and said output lens comprising, respectively, a pair of plano-convex positive lens elements positioned along the optical axis to disperse the sorce radiance into a distributed effective source as a function of the wavelength of the radiance and to position the effective source in the space of the entrance pupil, said mask being positioned relative to the output lens so that the ray bundles at each wavelength of the radiance spectrum converge at the same vertex in the plane of the mask.

2. The system of claim 1 wherein said source means includes a xenon lamp formed of a helical tube having a high radiance spectrum from 200 to 260 nanometers in the deep ultraviolet range and further includes means to provide high energy, short duration pulses of radiant energy of about 2,000 Joules at one pulse every three seconds.

3. The system of claim 1 wherein the magnification of the size of said source in the entrance pupil of said output lens is unity.

4. The system of claim 1 wherein the spacing between said mask and said projected plane is within the depth of focus of the system, the depth of focus being determined from the relationship:

$$K\lambda/NA^2$$

wherein K is 0.61 for spatially incoherent radiance, $\lambda$ is the peak wavelength of the radiance and NA is the numerical aperture of the system being equal to the sine of half the maximum total angle of the image-forming cone from said output lens to said mask.

5. The system according to claim 4 wherein the entrance pupil to said output lens is positioned so that no image of the radiant source is formed on the projected plane.

6. The system of claim 1 wherein the degree of spatial partial coherence is equal to the ratio of the diameter of the effective source image to the diameter of the entrance pupil, said input lens having a diameter sufficiently large to provide unity magnification of the source without vignetting.

7. The system of claim 2 wherein the image of said helical xenon lamp is 2.54 cm (1 inch) at said effective source location and the diameter of said mask at said projected plane is 12.25 cm (5 inches).

8. The system of claim 1 wherein the respective diameters of the entrance pupil and the output lens are made sufficiently large to pass all the respective ray bundles of the polychromatic radiance from said source to the mask.

9. The system of claim 1 wherein the ratio of the diameter of said output lens to the diameter of the image of said source at said nodal point is sufficiently large to provide a resolution of the mask image projected on said projected plane having a value of about one micrometer.

10. The system according to claim 1 wherein the wavelength of said source includes spectra in the deep ultraviolet range and said numerical aperture is sufficiently large to reduce significantly diffraction effects from said wafer to said projected plane.

* * * * *